(12) United States Patent
Lee et al.

(10) Patent No.: US 9,780,176 B2
(45) Date of Patent: Oct. 3, 2017

(54) HIGH RELIABILITY FIELD EFFECT POWER DEVICE AND MANUFACTURING METHOD THEREOF

(71) Applicant: ELECTRONICS AND TELECOMMUNICATIONS RESEARCH INSTITUTE, Daejeon (KR)

(72) Inventors: Jong Min Lee, Daejeon (KR); Byoung-Gue Min, Sejong-si (KR); Hyung Sup Yoon, Daejeon (KR); Dong Min Kang, Daejeon (KR); Dong-Young Kim, Daejeon (KR); Seong-Il Kim, Daejeon (KR); Hae Cheon Kim, Daejeon (KR); Jae Won Do, Daejeon (KR); Ho Kyun Ahn, Daejeon (KR); Sang-Heung Lee, Daejeon (KR); Jong-Won Lim, Daejeon (KR); Hyun Wook Jung, Daejeon (KR); Kyu Jun Cho, Daejeon (KR); Chull Won Ju, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/238,492

(22) Filed: Aug. 16, 2016

(65) Prior Publication Data

US 2017/0133471 A1 May 11, 2017

(30) Foreign Application Priority Data

Nov. 5, 2015 (KR) .................. 10-2015-0155050
Jul. 4, 2016 (KR) .................. 10-2016-0084160

(51) Int. Cl.
 *H01L 29/40* (2006.01)
 *H01L 29/20* (2006.01)
 (Continued)

(52) U.S. Cl.
 CPC ........ *H01L 29/408* (2013.01); *H01L 29/2003* (2013.01); *H01L 29/205* (2013.01); *H01L 29/66462* (2013.01); *H01L 29/7787* (2013.01)

(58) Field of Classification Search
 CPC ............. H01L 29/2003; H01L 29/7787; H01L 21/0254; H01L 21/02458; H01L 29/42316;
 (Continued)

(56) References Cited

U.S. PATENT DOCUMENTS 5,639,677 A 6/1997 Lee et al.
8,963,151 B2 2/2015 Lee et al.
(Continued)

FOREIGN PATENT DOCUMENTS

KR 10-2012-0124101 A 11/2012
KR 10-2015-0091704 A 8/2015

*Primary Examiner* — Roy Potter
(74) *Attorney, Agent, or Firm* — Rabin & Berdo, P.C.

(57) ABSTRACT

The present invention relates to a high reliability field effect power device and a manufacturing method thereof. A method of manufacturing a field effect power device includes sequentially forming a transfer layer, a buffer layer, a barrier layer and a passivation layer on a substrate, patterning the passivation layer by etching a first region of the passivation layer, and forming at least one electrode on the first region of the barrier layer exposed by patterning the passivation layer, wherein the first region is provided to form the at least one electrode, and the passivation layer may include a material having a wider bandgap than the barrier layer to prevent a trapping effect and a leakage current of the field effect power device.

20 Claims, 8 Drawing Sheets

(51) Int. Cl.
*H01L 29/205* (2006.01)
*H01L 29/778* (2006.01)
*H01L 29/66* (2006.01)

(58) Field of Classification Search
CPC ... H01L 29/518; H01L 29/408; H01L 29/205; H01L 29/66462
See application file for complete search history.

(56) References Cited

U.S. PATENT DOCUMENTS

| | | | |
|---|---|---|---|
| 2006/0244011 A1* | 11/2006 | Saxler | H01L 29/7783 257/194 |
| 2007/0295985 A1* | 12/2007 | Weeks | H01L 29/0657 257/183 |
| 2011/0012110 A1* | 1/2011 | Sazawa | H01L 29/517 257/51 |
| 2014/0209918 A1 | 7/2014 | Chen et al. | |
| 2015/0206847 A1 | 7/2015 | Kim et al. | |
| 2015/0249150 A1 | 9/2015 | Yamaguchi et al. | |

* cited by examiner

HIGH RELIABILITY FIELD EFFECT POWER DEVICE AND MANUFACTURING METHOD THEREOF

CROSS-REFERENCE TO RELATED APPLICATION

The present application claims priority to Korean patent application number 10-2015-0155050 filed on Nov. 5, 2015 and Korean patent application number 10-2016-0084160 filed on Jul. 4, 2016, the entire disclosures of which are incorporated herein in its entirety by reference.

BACKGROUND

Field of Invention

Various embodiments of the inventive concept of the present disclosure relate to a high reliability field effect power device and a manufacturing method thereof.

Description of Related Art

In line with developments of various types of wireless communication technologies and semiconductor technologies, field effect power devices have been used as the basic device in various fields. In particular, since a compound semiconductor heterojunction field effect power device, such as an AlGaN/GaN power device, has excellent characteristics based on physical properties of a compound semiconductor, it has come to prominence as the next power device.

Research has been actively conducted to improve frequency characteristics and output power characteristics which are the characteristics of a field effect power device. However, high reliability is to be ensured such that a field effect power device can be used in various fields. Since the trapping effect and current leakage of a field effect power device result in degradation of reliability of the device, the trapping effect and the current leakage may be prevented.

In this connection, various methods have recently been proposed. However, these methods are not the proper solutions because most of them require complicated processes or increase manufacturing costs.

SUMMARY

Various embodiments of the present disclosure are to provide a field effect power device and a manufacturing method thereof improving reliability by preventing a trapping effect and a leakage current.

According to an embodiment, there is provided a method of manufacturing a field effect power device, the method including: sequentially forming a transfer layer, a buffer layer, a barrier layer and a passivation layer on a substrate, patterning the passivation layer by etching a first region of the passivation layer, and forming at least one electrode on the first region of the barrier layer exposed by patterning the passivation layer, wherein the first region is provided to form the at least one electrode, and the passivation layer may include a material having a wider bandgap than the barrier layer to prevent a trapping effect and a leakage current of the field effect power device.

The passivation layer may include aluminum nitride (AlN).

The patterning of the passivation layer by etching the first region of the passivation layer may include depositing a first insulating layer onto the passivation layer, patterning the first insulating layer by etching the first region of the first insulating layer, and patterning the passivation layer by using the first insulating layer as a mask.

The patterning of the passivation layer may include selectively etching the first region of the passivation layer exposed by patterning the first insulating layer.

The forming of the at least one electrode may include forming a first insulating film on a portion adjacent to the passivation layer in the first region of the barrier layer, and forming the at least one electrode on a portion where the first insulating film is not formed in the first region of the barrier layer.

The first insulating film may include a nitride.

The first insulating film may separate the at least one electrode from the passivation layer and prevent the trapping effect and the leakage current of the field effect power device.

The forming of the first insulating film may include forming a second insulating layer on the first region of the barrier layer, etching a portion adjacent to the passivation layer from the second insulating layer, depositing the first insulating film onto a portion adjacent to the passivation layer in the first region of the barrier layer, the portion exposed by etching the second insulating layer, and removing the second insulating layer.

The etching of the portion adjacent to the passivation layer from the second insulating layer may include forming a first photoresist film on the second insulating layer, patterning the first photoresist film by etching the first photoresist film, except for the first region, over etching the second insulating layer by using the first photoresist film as a mask, and removing the first photoresist film.

A length of the at least one electrode may be determined by patterning the first photoresist film and over etching the second insulating layer.

The forming of the at least one electrode may include depositing the second photoresist film onto the passivation layer, the at least one electrode and the first insulating film, patterning the first region of the second photoresist film by etching a portion where the first insulating film is not formed from the first region, and forming the at least one electrode on a portion of the first region of the barrier layer on which the first insulating film is not formed, the portion exposed by patterning the second photoresist film.

The method may further include depositing a second insulating film on the passivation layer, the at least one electrode and the first insulating film.

The at least one electrode may include a gate, a source, and a drain.

According to an embodiment, there is provided a field effect power device, including: a substrate, a transfer layer formed on the substrate, a buffer layer formed on the transfer layer, a barrier layer formed on the buffer layer, one or more electrodes formed on the barrier layer, and a passivation layer formed between the one or more one electrodes on the barrier layer, wherein the passivation layer may include a material having a wider bandgap than the barrier layer to prevent a trapping effect and a leakage current of the field effect power device.

The passivation layer may include aluminum nitride (AlN).

The field effect power device may further include a first insulating film formed between the one or more electrodes and the passivation layer.

The first insulating film may include a nitride.

The first insulating film may separate the one or more electrodes from the passivation layer and prevent the trapping effect and the leakage current of the field effect power device.

The field effect power device may further include a second insulating film formed on the passivation layer, the one or more electrodes and the first insulating film.

The one or more electrodes may include a gate, a source and a drain.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In describing embodiments of the present invention, portions not relating to the present invention will be omitted so as not unnecessarily obscure the gist of the present invention.

The meaning of "include," "comprise," "including," or "comprising," specifies a property, a region, a fixed number, a step, a process, an element and/or a component but does not exclude other properties, regions, fixed numbers, steps, processes, elements and/or components. In the description of embodiments, it will be understood that when a layer (or film) is referred to as being 'on/over' another layer or substrate, it can be directly on the layer or substrate, or intervening layers may also be present.

The terms of a singular form may include plural forms unless referred to the contrary.

Hereinafter, embodiments of the invention will be described in detail with reference to the accompanying drawings.

Figure 1:
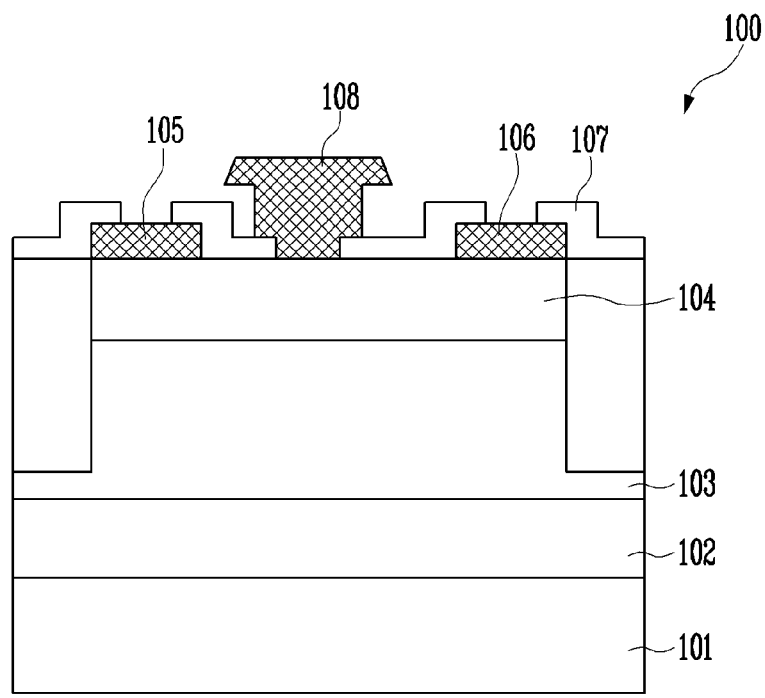
FIG. 1 is a diagram illustrating the structure of a typical field effect power device.

FIG. 1 is a diagram illustrating the structure of a typical field effect power device.

A GaN-based field effect power device having excellent characteristics has been used in various application fields. An AlGaN/GaN power device is the most widely used GaN-based field effect power device. This AlGaN/GaN power device may be manufactured by bonding an AlGaN layer having a wider bandgap on a GaN epitaxial layer and forming a channel on a joint surface, so that the AlGaN/GaN power device may have high frequency characteristics and excellent power characteristics. An AlGaN/GaN power device may be used as the core device of a power amplifier having high output characteristics.

The most important and expensive component in a communication system may be a power amplifier. Power amplifiers may be the most important key devices in military components as well as wireless communications including the fourth-generation LTE communications and the fifth-generation communications. Therefore, the power amplifier may require particularly high reliability, and research has been actively conducted on field effect power devices constituting power amplifiers.

A field effect power device applied in a power amplifier may generate the highest output at transmission and reception terminals. Indicators representing characteristics of field effect power devices may include output power, output gain, P1 dB, and efficiency. Field effect power devices may be mainly classified on the basis of output power, among these indicators. The output power may refer to a predetermined size of power that a field effect power device can output to an external source since output power thereof is saturated.

To increase output power, a structure in which a plurality of devices are connected in parallel may be adopted. However, even when a large number of devices are connected in parallel, an increase in output power may be limited due to internal limitations that the devices actually have. Power gain may also be drastically reduced.

Characteristics of the above-described field effect power device may be affected by an epitaxial layer constituting the device and the structure of the device. In particular, RF characteristics of the field effect power device may be affected by the source-gate distance and the gate-drain distance. Therefore, an optimum device structure is to be determined through a lot of research so that the field effect power device can overcome the above-described limitations and have optimum device characteristics.

FIG. 1 illustrates a GaN-based field effect power device having a general device structure.

To manufacture a field effect power device 100 shown in FIG. 1, an epitaxial layer may be formed first. The epitaxial layer may be formed on a substrate 101, such as a Si or SiC substrate, or a sapphire substrate.

A transfer layer 102 having a large thickness may be formed on the substrate 101 to grow the epitaxial layer. A buffer layer 103 may be formed on the transfer layer 102. A barrier layer 104 may be formed on the buffer layer 103.

Subsequently, ohmic electrodes (source and drain) 105 and 106 may be formed on the barrier layer 104, isolation 107 may be performed thereon, and a gate 108 may be formed. Finally, the field effect power device 100 may be realized by passivation of a device.

FIG. 1 illustrates one source 105, one gate 108, and one drain 106. However, the numbers of sources, gates, and drains may vary depending on how a field effect power device is embodied.

As illustrated in FIG. 1, the field effect power device 100 may be a 3-port electronic device including the source 105, the gate 108, and the drain 106. The gate 108 may form an input port, the drain 106 may form an output port, and the source 105 may be grounded.

In the field effect power device 100 manufactured by the above-described manufactured method as illustrated in FIG. 1, the barrier layer 104 having a greater bandgap than the buffer layer 103 may be formed on the GaN buffer layer 103, and a two-dimensional (2D) channel may be formed such that carriers may move through the 2D channel. In addition, the manufactured field effect power device 100 may have high frequency characteristics and high output power characteristics.

However, the reliability of the field effect power device 100 may be degraded due to the trapping effect and the leakage current from itself.

The trapping effect may be present in the epitaxial layer of the field effect power device 100 or at the interface between the electrode and the epitaxial layer. More specifically, the trapping effect may occur at the lower portion of the gate 108, the GaN buffer layer 103, the surface of the barrier layer 104 having a large bandgap, or the device surface between the source 105 and the gate 108 and between the gate 108 and the drain 106.

The leakage current may be a gate Schottky contact leakage current, a substrate leakage current, or a surface leakage current.

For actual commercialization of a power device, reliability of the power device is to be measured, and the measured reliability is to satisfy a predetermined level. Therefore, to ensure high reliability of the field effect power device 100, a leakage current path may be eliminated from the barrier layer 104 and the trapping effect may be prevented.

In the field effect power device 100 having the general structure as shown in FIG. 1, passivation using an insulating layer for protection of the surface of the device may be applied in order to ensure high reliability. A dielectric material, such as a silicon nitride ($SiN_x$), may be used as the insulating layer. Examples of the dielectric material may include SiNx, $SiO_2$, and $Al_2O_3$. However, since perfect passivation using an insulating layer is practically impossible, degradation of reliability may occur due to the trapping effect and the leakage current when the insulating layer is formed.

According to an embodiment, by preventing the trapping effect and the generation of the leakage current as described above, a field effect power device having high reliability and a manufacturing method thereof may be provided. This manufacturing method may be applied to various field effect power devices including a GaN-heterojunction field effect power device in widespread use.

Hereinafter, a method of manufacturing a field effect power device according to an embodiment is described in detail.

FIGS. 2 to 15 are diagrams illustrating a method of manufacturing a field effect power device according to an embodiment.

Figure 2:
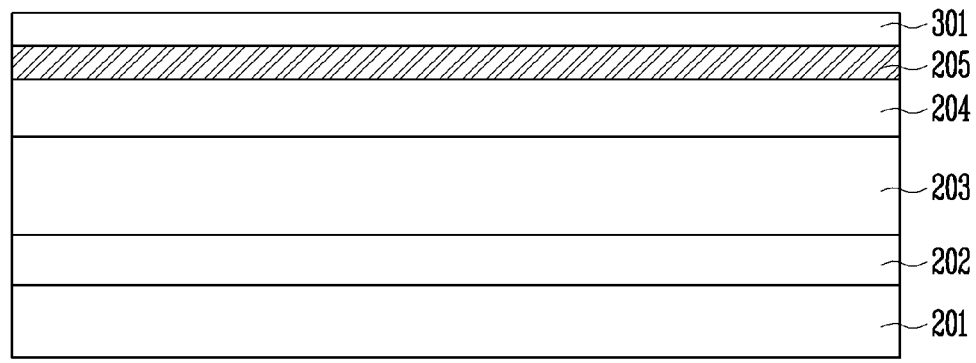
FIGS. 2 to 15 are diagrams illustrating a method of manufacturing a field effect power device according to an embodiment.

Referring to FIG. 2, according to a method of manufacturing a field effect power device, an epitaxial layer may be grown first. More specifically, a transfer layer 202, a buffer layer 203, a barrier layer 204, and a passivation layer 205 may be sequentially grown on a substrate 201.

According to an embodiment, when a field effect power device is an AlGaN/GaN heterojunction power device, the barrier layer 204 may be an AlGaN layer and the buffer layer 203 may be a GaN layer. However, the barrier layer 204 may not be limited to the AlGaN layer. Various epitaxial layers having a wide bandgap forming a two-dimensional channel layer may be used to form the barrier layer 204.

According to various embodiments, in order to prevent trapping effects and a leakage current of a field effect power device, the passivation layer 205 may be formed. The passivation layer 205 may be formed on the barrier layer 204 by using an epitaxial growth method and prevent the trapping effect between the barrier layer 204 and the passivation layer 205. According to various embodiments, the passivation layer 205 may include aluminum nitride (AlN). However, the invention is not limited thereto, and the passivation layer 205 may be formed using an arbitrary material having a wider bandgap than the barrier layer 204.

Although the passivation layer 205 does not affect operations of the field effect power device, the passivation layer 205 may affect the strain of the epitaxial layer. In other words, the total thickness of the barrier layer 204 and the passivation layer 205 and a thickness ratio therebetween may be appropriately determined since they may affect device characteristics.

A first insulating layer 301 for patterning may be deposited on the epitaxial layer.

Figure 3:
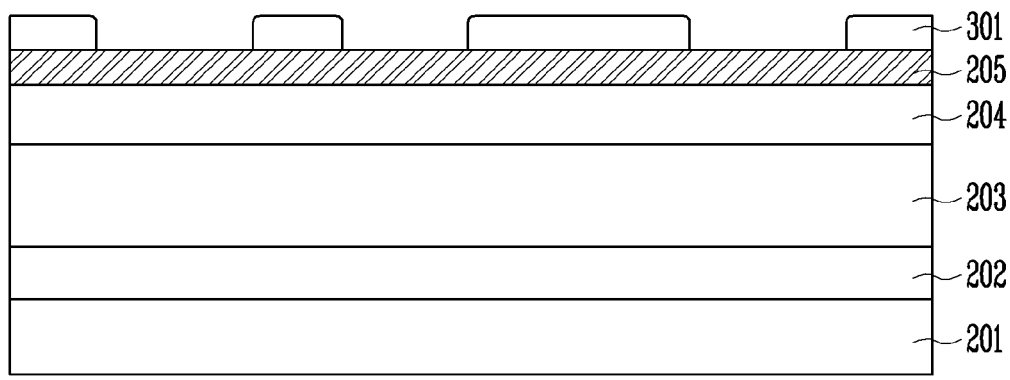

Subsequently, as shown in FIG. 3, the first insulating layer 301 may be patterned to define a region where electrodes are formed. According to an embodiment, the first insulating layer 301 may be patterned by selectively etching portions from the first insulating layer 301 to define the region where electrodes, such as source, gate, and drain, are formed. As the first insulating layer 301 is patterned, the passivation layer 205 may be exposed through the region where the source, the gate, and the drain are formed.

Figure 4:
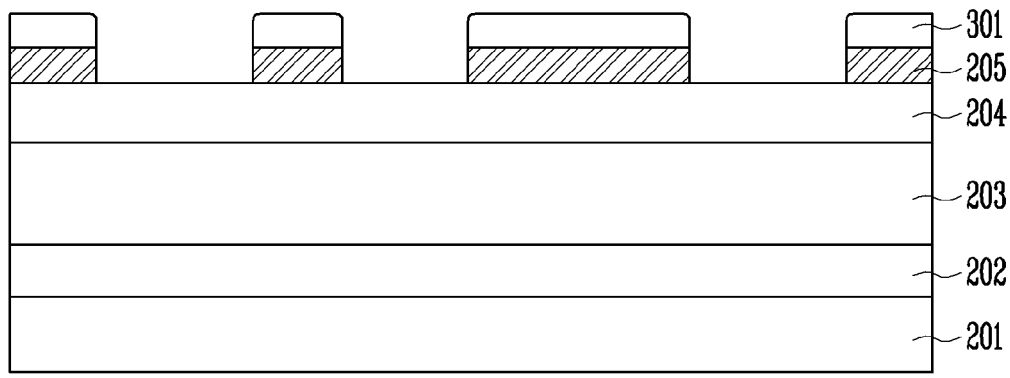

Subsequently, as illustrated in FIG. 4, portions of the exposed passivation layer 205 may be etched using the patterned first insulating layer 301 as a mask. In other words, according to an embodiment, the region where the source, the gate, and the drain are formed may be etched from the passivation layer 205. As the passivation layer 205 is etched, portions of the barrier layer 204 may be exposed. In other words, the portions where the source, the gate, and the drain are formed may be exposed on the barrier layer 204.

However, when electrodes are directly formed on the passivation layer 205 without removing the passivation layer 205 at positions corresponding to the portions on which the source, gate and drain electrodes are formed, characteristics of a field effect power device may be greatly changed by the passivation layer 205 having a relatively wide bandgap. In other words, it may be difficult to directly form source and drain electrodes, which are ohmic electrodes, on the passivation layer 205, and to control a channel layer of a gate which is a Schottky electrode. Therefore, according to an embodiment, by etching the region where electrodes are formed from the passivation layer 205, and exposing the barrier layer 204, the electrodes may be easily formed without causing the passivation layer 205 to affect the characteristics of the device.

The passivation layer 205 may be etched by selective etching. An etching solution having selective etching characteristics may be used. The etching solution may be, for example, an etchant such as AZ400K. The passivation layer 205 may be selectively etched by the etching solution such as AZ400K.

Figure 5:
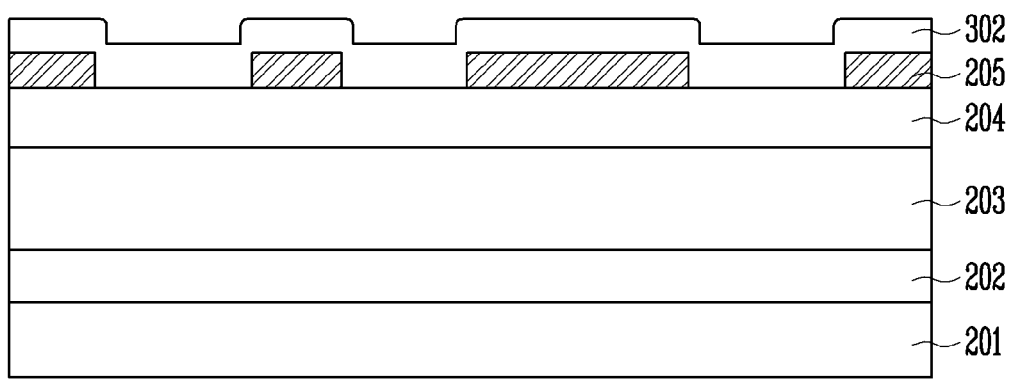

Subsequently, according to an embodiment, the first insulating layer 301 may be removed and a second insulating layer 302 may be deposited thereon as shown in FIG. 5. According to various embodiments, the second insulating layer 302 may include $SiO_2$ and the second insulating layer 302 may be deposited onto the device by using a CVD method.

Figure 6:
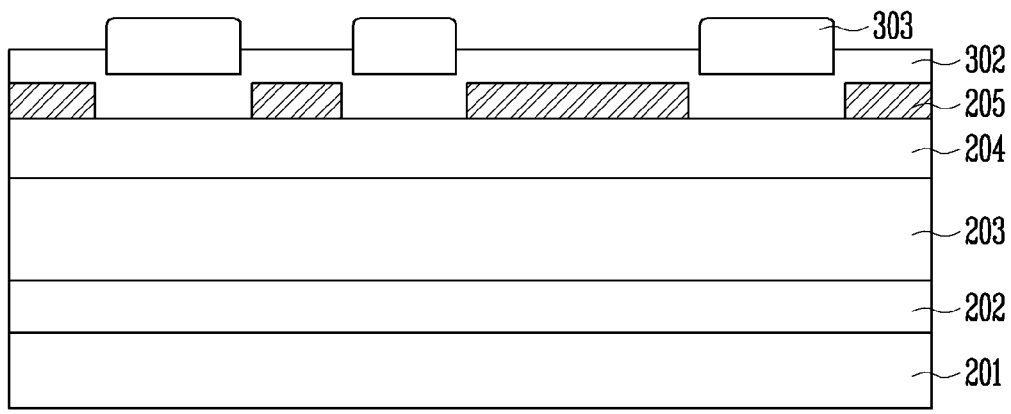

Subsequently, according to an embodiment, as shown in FIG. 6, a first photoresist film 303 may be formed on the second insulating layer 302 and then patterned to define a region where electrodes are formed. According to an embodiment, the first photoresist film 303 may be patterned by etching the first photoresist film 303, except for the region where electrodes, such as a source, a gate, and a drain are formed. Since the first photoresist film 303 is etched, the second insulating layer 302 may be exposed through the region where the electrodes are formed. By controlling the region to be etched from the first photoresist film 303, it may possible to appropriately control a length of the exposed region of the second insulating layer 302. Here, the term "length" has a similar or same meaning as "size."

Figure 7:
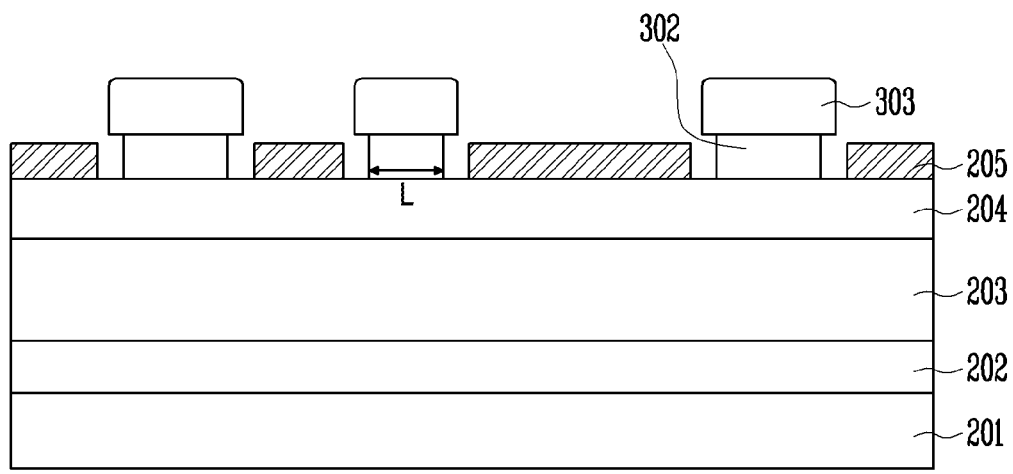

Subsequently, as shown in FIG. 7, a portion of the exposed second insulating layer 302 may be etched using the patterned first photoresist film 303 as a mask. In other words, the entire second insulating layer 302 may be etched, except for the region where electrodes are formed. Since the second insulating layer 302 is etched, the passivation layer 205 may be exposed through a region where the electrodes are not formed.

The second insulating layer 302 may be removed by etching. When the second insulating layer 302 includes an oxide, an etching solution may be, for example, buffered oxide etchant (BOE).

The second insulating layer 302 may be over etched. When the second insulating layer 302 is over etched using the patterned first photoresist film 303 as a mask, an undercut of the second insulating layer 302 may occur under the first photoresist film 303 as illustrated in FIG. 7. In the undercut region, the barrier layer 204 may be partially exposed by etching the second insulating layer 302. In other words, the barrier layer 204 may be exposed on a portion adjacent to the passivation layer 205 in the region, where electrodes are formed.

A length L of the remaining second insulating layer 302 after the etching process may determine a length of a gate. The length L may be adjusted by controlling the patterning and the generation of the undercut of the first photoresist film 303. In other words, when the first photoresist film 303 is patterned, the length of the gate of the field effect power device may be determined by controlling the length of the exposed region of the second insulating layer 302.

In terms of characteristics of a field effect power device, a length of a gate may be a very important factor. According to an embodiment, since the length of the gate is adjusted by controlling the patterning and the generation of the undercut of the first photoresist film 303, the characteristics of the field effect power device may be appropriately controlled in response to its applications. For example, according to an embodiment, in order to improve high frequency characteristics of a field effect power device, the patterning and the undercut of the first photoresist film 303 may be controlled to minimize the length of the gate.

Figure 8:
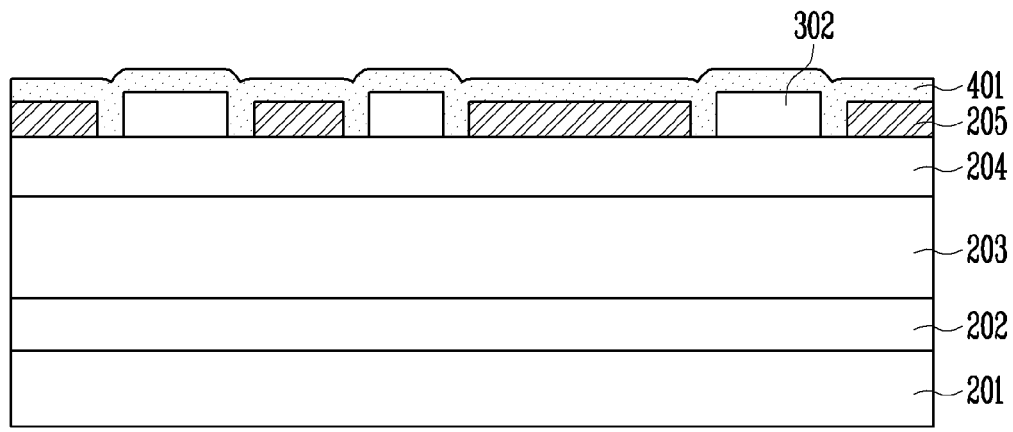

Subsequently, according to an embodiment, after the first photoresist film 303 is removed, a first insulating film 401 may be deposited thereon as illustrated in FIG. 8. The first insulating film 401 may be a different material from the second insulating layer 302, for example, a nitride.

Referring to FIG. 7, the passivation layer 205 may be exposed on a region where the electrodes are not formed after the first photoresist film 303 is removed. The barrier layer 204 may be exposed on a portion (space between the second insulating layer 302 and the passivation layer 205) of the region where the electrodes are formed, the portion adjacent to the passivation layer 205. The second insulating layer 302 may be exposed in the remaining portions.

Therefore, the first insulating film 401 may be deposited over the entire areas of the passivation layer 205 and the second insulating layer 302 that are exposed through the above-described processes. In addition, the first insulating film 401 may be deposited onto a portion of the barrier layer 204 that is exposed by the undercut of the second insulating layer 302.

Figure 9:
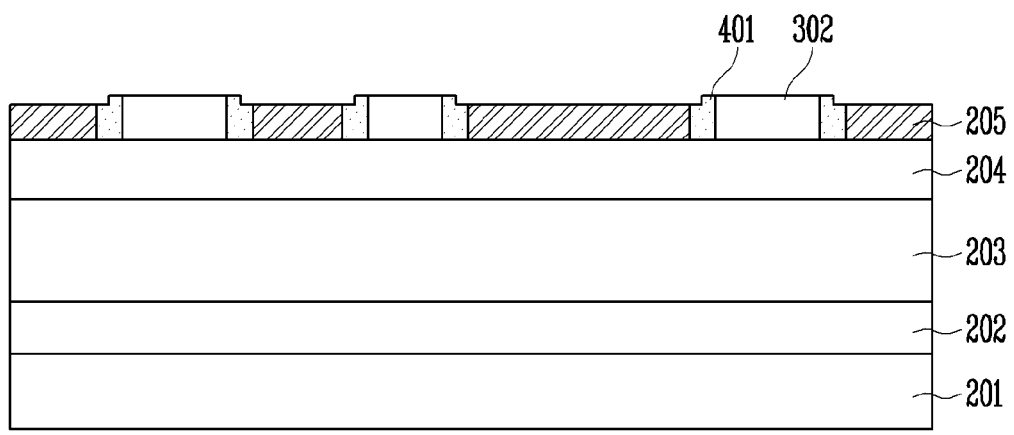

Subsequently, according to an embodiment, as illustrated in FIG. 9, the first insulating film 401 deposited onto the passivation layer 205 and the second insulating layer 302 may be etched. The first insulating film 401 may be etched by dry etching. Reactive ion etch (RIE) or inductively coupled plasma (ICP) may be used for dry etching.

When the first insulating film 401 deposited onto the passivation layer 205 and the second insulating layer 302 is etched, the passivation layer 205 and the second insulating layer 302 may be exposed again, so that only the first insulating film 401 deposited onto the barrier layer 204 may remain. As a result, the space between the passivation layer 205 and the second insulating layer 302 may be filled with the first insulating film 401. In other words, the first insulating film 401 may be formed on portions adjacent to the passivation layer 205 in the region where the electrodes are formed.

As described above, the second insulating layer 302 may correspond to the region where electrodes are formed. When the electrodes are formed on the second insulating layer 302 through processes to be described below, the first insulating film 401 between the electrodes and the passivation layer 205 may separate the passivation layer 205 from the electrodes to thereby protect the electrode against the passivation layer 205. In addition, the first insulating film 401 may prevent the trapping effect and the leakage current.

Figure 10:
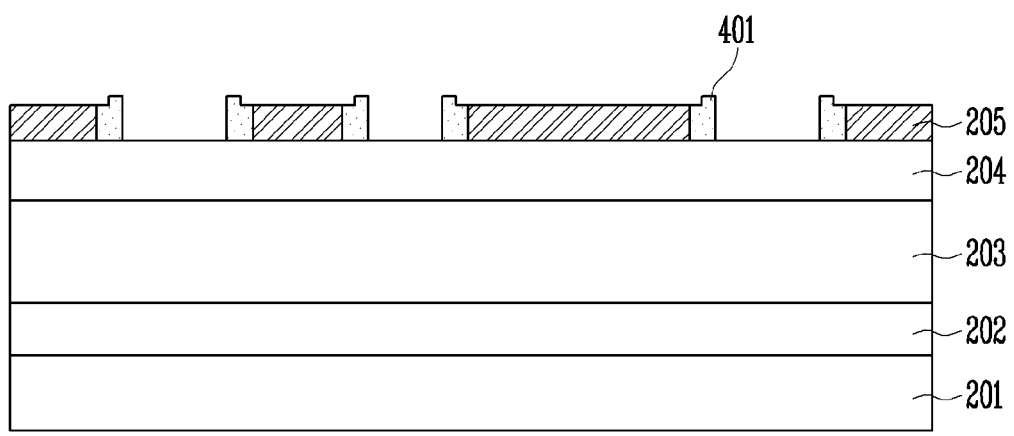

Subsequently, as illustrated in FIG. 10, the second insulating layer 302 may be removed. As the second insulating layer 302 is removed, the region where the electrodes are formed may be exposed on the barrier layer 204. The second insulating layer 302 may be removed by etching. When the second insulating layer 302 includes an oxide, an etching solution may be buffered oxide etchant (BOE) as described above.

Subsequently, according to an embodiment, an electrode patterning process and an electrode forming process may be performed.

Figure 11:
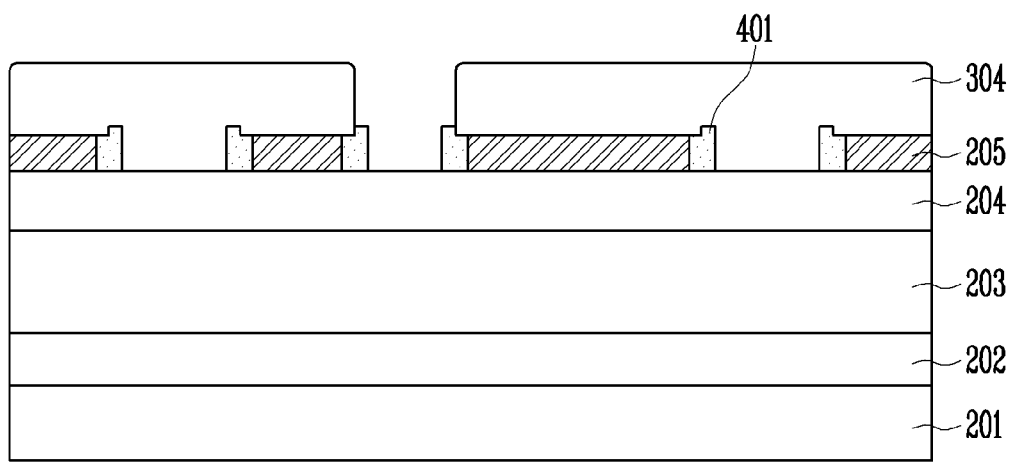

More specifically, according to an embodiment, as illustrated in FIG. 11, after the second photoresist film 304 is deposited, a region where a gate is formed may be patterned. When the second photoresist film 304 is patterned, the barrier layer 204 may be exposed on the region where the gate is formed.

Figure 12:
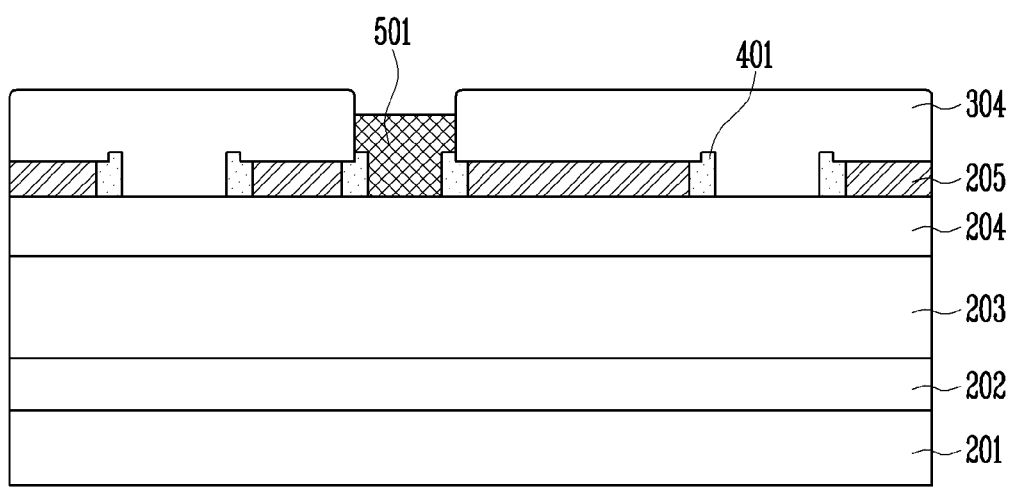

Subsequently, as illustrated in FIG. 12, a gate 501 may be formed on the exposed barrier layer 204. In the field effect power device, the gate 501 may be formed in Schottky contact. In addition, the gate 501 may be formed using Ni/Au.

After the gate 501 is formed, the second photoresist film 304 may be removed.

Figure 13:
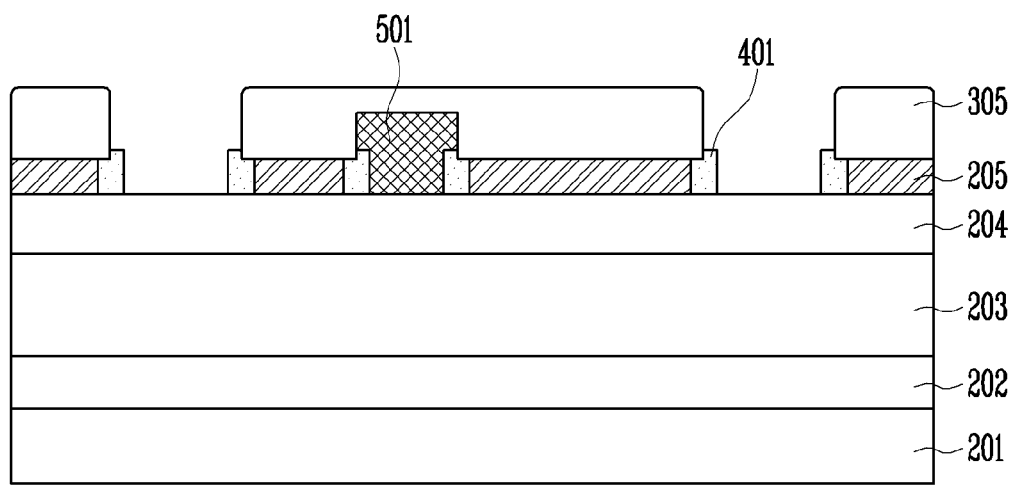

In the same manner, according to an embodiment, as illustrated in FIG. 13, a third photoresist film 305 may be deposited and patterned to define a region in which a source and a drain are formed. When the third photoresist film 305 is patterned, the barrier layer 204 may be exposed on the region in which the source and the drain are formed.

Figure 14:
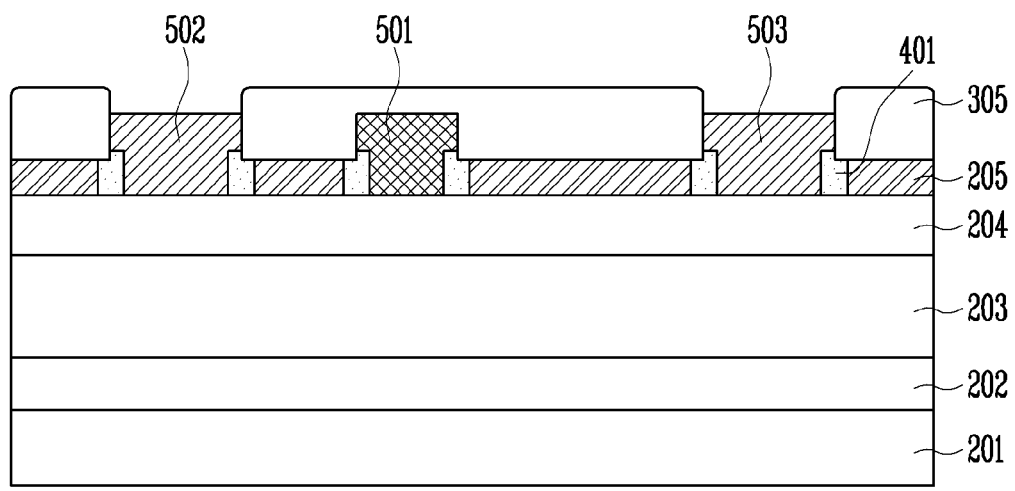

Subsequently, as illustrated in FIG. 14, a source 502 and a drain 503 may be formed on the exposed barrier layer 204. The source 502 and the drain 503 may include ohmic electrodes and include a different material from the gate. The source 502 and the drain 503 may include a non-alloying metal, i.e., a metal which does not require an alloying process. For example, the source 502 and the drain 503 may include Cr/Au, Ti/Au, or the like.

The source 502 and the drain 503 may be deposited onto the barrier layer 204 by using equipment such as an e-beam evaporator.

Figure 15:
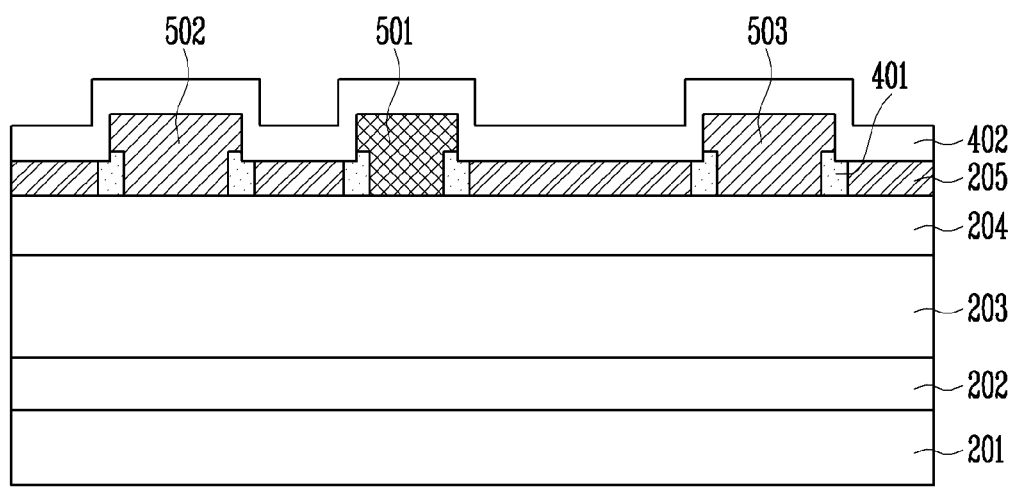

After the source 502 and the drain 503 are formed, the third photoresist film 305 may be removed. As illustrated in FIG. 15, the second insulating film 402 may be deposited for the protection of the device. As a result, the field effect power device may be completed.

Figure 16:
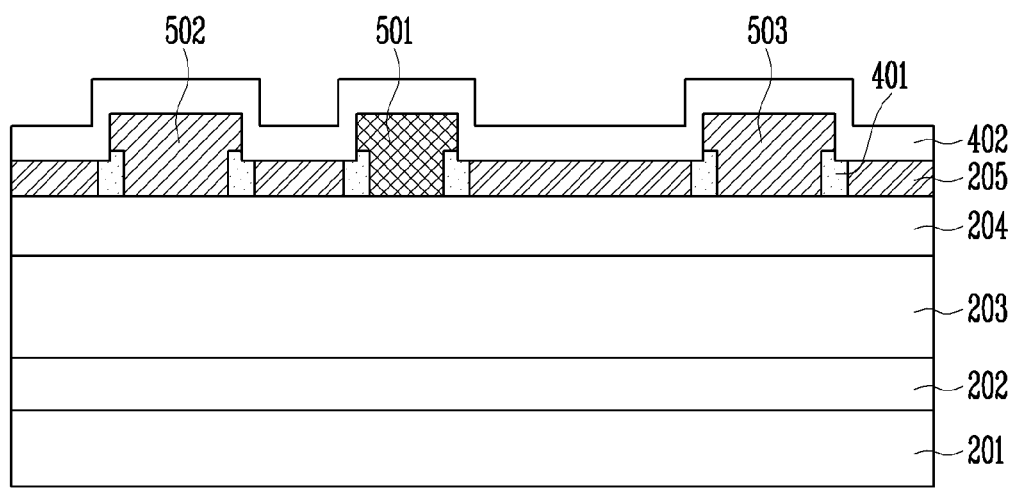
FIG. 16 is a diagram illustrating the structure of a field effect power device manufactured by a method of manufacturing the same according to an embodiment.

FIG. 16 is a diagram illustrating the structure of a field effect power device manufactured by a method of manufacturing the same.

In a field effect power device manufactured by a method of manufacturing the same according to an embodiment, the passivation layer 205 may be formed on portions of the barrier layer 204 where the electrodes (501, 502, and 503) are not formed. In addition, the passivation layer 205 may be sufficiently spaced apart from the electrodes (501, 502, and 503) by the first insulating film 401, so that the surface of the barrier layer 204 may be prevented from the trapping effect and the leakage current without affecting the operations of the field effect power device.

According to the above-described embodiments, the field effect power device including the single gate 501, the single source 502, and the single drain 503 is illustrated as an example. However, a field effect power device may include a plurality of gates, sources and drains may be provided. The invention is also applicable to this field effect power device including the plurality of gates, sources and drains without departing from the sprit or scope of the invention.

According to a high reliability field effect power device and a manufacturing method thereof according to an embodiment, by using less complex, simplified processes, a high reliability field effect power device used in an amplifier circuit and a module may be manufactured.

In addition, according to a high reliability field effect power device and a manufacturing method thereof according to an embodiment, the trapping effect and the leakage current affecting the reliability of the field effect power device may be prevented and characteristics of the device may be easily controlled.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a field effect power device, the method comprising:
   sequentially forming a transfer layer, a buffer layer, a barrier layer and a passivation layer on a substrate;
   patterning the passivation layer by etching a first region of the passivation layer; and
   forming at least one electrode on the first region of the barrier layer exposed by patterning the passivation layer,
   wherein the first region is provided to form the at least one electrode, and
   the passivation layer includes a material having a wider bandgap than the barrier layer to prevent a trapping effect and a leakage current of the field effect power device.

2. The method of claim 1, wherein the passivation layer includes aluminum nitride (AlN).

3. The method of claim 1, wherein the patterning of the passivation layer by etching the first region of the passivation layer comprises:
   depositing a first insulating layer onto the passivation layer;
   patterning the first insulating layer by etching the first region of the first insulating layer; and
   patterning the passivation layer by using the first insulating layer as a mask.

4. The method of claim 3, wherein the patterning of the passivation layer comprises selectively etching the first region of the passivation layer exposed by patterning the first insulating layer.

5. The method of claim 1, wherein the forming of the at least one electrode comprises:
   forming a first insulating film on a portion adjacent to the passivation layer in the first region of the barrier layer; and
   forming the at least one electrode on a portion where the first insulating film is not formed in the first region of the barrier layer.

6. The method of claim 5, wherein the first insulating film includes a nitride.

7. The method of claim 5, wherein the first insulating film separates the at least one electrode from the passivation layer and prevents the trapping effect and the leakage current of the field effect power device.

8. The method of claim 5, wherein the forming of the first insulating film comprises:
   forming a second insulating layer on the first region of the barrier layer;
   etching a portion adjacent to the passivation layer from the second insulating layer;
   depositing the first insulating film onto a portion adjacent to the passivation layer in the first region of the barrier layer, the portion exposed by etching the second insulating layer; and
   removing the second insulating layer.

9. The method of claim 8, wherein the etching of the portion adjacent to the passivation layer from the second insulating layer comprises:
   forming a first photoresist film on the second insulating layer;
   patterning the first photoresist film by etching the first photoresist film, except for the first region;
   over etching the second insulating layer by using the first photoresist film as a mask; and
   removing the first photoresist film.

10. The method of claim 8, wherein a length of the at least one electrode is determined by patterning the first photoresist film and over etching the second insulating layer.

11. The method of claim 5, wherein the forming of the at least one electrode comprises:
   depositing the second photoresist film onto the passivation layer, the at least one electrode and the first insulating film;
   patterning the first region of the second photoresist film by etching a portion where the first insulating film is not formed from the first region; and
   forming the at least one electrode on a portion of the first region of the barrier layer on which the first insulating film is not formed, the portion exposed by patterning the second photoresist film.

12. The method of claim 5, further comprising depositing a second insulating film on the passivation layer, the at least one electrode and the first insulating film.

13. The method of claim 1, wherein the at least one electrode includes a gate, a source, and a drain.

14. A field effect power device, comprising:
a substrate;
a transfer layer formed on the substrate;
a buffer layer formed on the transfer layer;
a barrier layer formed on the buffer layer;
electrodes formed on the barrier layer; and
a passivation layer formed between the electrodes on the barrier layer,
wherein the passivation layer includes a material having a wider bandgap than the barrier layer to prevent a trapping effect and a leakage current of the field effect power device.

15. The field effect power device of claim 14, wherein the passivation layer includes aluminum nitride (AlN).

16. The field effect power device of claim 14, further comprising a first insulating film formed between the electrodes and the passivation layer.

17. The field effect power device of claim 16, wherein the first insulating film includes a nitride.

18. The field effect power device of claim 16, wherein the first insulating film separates the electrodes from the passivation layer and prevents the trapping effect and the leakage current of the field effect power device.

19. The field effect power device of claim 16, further comprising a second insulating film formed on the passivation layer, the electrodes and the first insulating film.

20. The field effect power device of claim 14, wherein the electrodes include a gate, a source and a drain.

* * * * *